(12) United States Patent
Leow et al.

(10) Patent No.: US 11,747,209 B2
(45) Date of Patent: Sep. 5, 2023

(54) SYSTEM AND METHOD FOR THERMALLY CALIBRATING SEMICONDUCTOR PROCESS CHAMBERS

(71) Applicant: ASM IP HOLDING BV, Almere (NL)

(72) Inventors: Yen Lin Leow, Phoenix, AZ (US); Caleb Koy Miskin, Mesa, AZ (US); Hyeongeu Kim, Phoenix, AZ (US)

(73) Assignee: ASM IP Holding, B.V., Almere (NL)

( * ) Notice: Subject to any disclaimer, the term of this patent is extended or adjusted under 35 U.S.C. 154(b) by 32 days.

(21) Appl. No.: 16/923,717

(22) Filed: Jul. 8, 2020

(65) Prior Publication Data

US 2020/0333189 A1    Oct. 22, 2020

Related U.S. Application Data

(62) Division of application No. 16/126,863, filed on Sep. 10, 2018, now Pat. No. 10,732,046.

(51) Int. Cl.
| | |
|---|---|
| *H01L 21/67* | (2006.01) |
| *G01J 5/00* | (2022.01) |
| *H01L 21/66* | (2006.01) |
| *C23C 16/52* | (2006.01) |
| *G01J 5/80* | (2022.01) |

(52) U.S. Cl.
CPC ............. *G01J 5/00* (2013.01); *C23C 16/52* (2013.01); *H01L 21/67115* (2013.01); *H01L 21/67248* (2013.01); *H01L 22/20* (2013.01); *G01J 5/80* (2022.01)

(58) Field of Classification Search
CPC ...... G01J 5/00; G01J 2005/0048; H01L 22/20
See application file for complete search history.

(56) References Cited

U.S. PATENT DOCUMENTS

| | | | |
|---|---|---|---|
| 6,924,463 B2 | 8/2005 | Donald et al. | |
| 2007/0020784 A1* | 1/2007 | Timans | H01L 21/67115 |
| | | | 438/16 |
| 2008/0002753 A1 | 1/2008 | Timans | |
| 2012/0170609 A1* | 7/2012 | Gurary | G01J 5/0007 |
| | | | 374/2 |
| 2012/0201267 A1* | 8/2012 | Patalay | G01J 5/20 |
| | | | 374/1 |

(Continued)

*Primary Examiner* — Mounir S Amer
*Assistant Examiner* — Alexander Belousov
(74) *Attorney, Agent, or Firm* — Banner & Witcoff, Ltd.

(57) ABSTRACT

A system and method for thermally calibrating semiconductor process chambers is disclosed. In various embodiments, a first non-contact temperature sensor can be calibrated to obtain a first reading with the semiconductor process chamber. The first reading can be representative of a first temperature at a first location. The first non-contact temperature sensor can be used to obtain a second reading representative of a second temperature of an external thermal radiation source. The second temperature of the external thermal radiation source can be adjusted to a first temperature setting of the external radiation source such that the second reading substantially matches the first reading. Additional non-contact temperature sensor(s) can be directed at the external thermal radiation source and can be adjusted such that the reading(s) of the additional non-contact sensors are calibrated and matched to one another.

20 Claims, 8 Drawing Sheets

(56) References Cited

U.S. PATENT DOCUMENTS

2013/0343426 A1* 12/2013 Gurary ................... G01J 5/602
 374/121
2018/0114680 A1 4/2018 Kim et al.
2020/0080894 A1 3/2020 Leow et al.

* cited by examiner

| (1) First Reading of Non-Contact Sensor A, °C | (2) Furnace Temp (Second Temperature Setting) determined using Sensor A, °C | (3) Second Reading of a Non-Contact Sensor B using the Second Temperature Setting of Sensor A, °C | (4) Second Reading of a Non-Contact Sensor C using the Second Temperature Setting of Sensor A, °C |
|---|---|---|---|
| 400.5 | 431 | 395.4 | 405.1 |
| 450.1 | 466.3 | 445.0 | 455.5 |
| 500 | 503.3 | 497.4 | 504.4 |
| 600.3 | 587.3 | 597.2 | 605.7 |
| 749.5 | 713 | 747.9 | 753.3 |
| 819.6 | 770.6 | 817.4 | 821.1 |
| 875 | 817.4 | 872.8 | 878.1 |

FIG. 5

|  | Average Pyro Main Process (1) | Average C-TC Main Process (2) |
|---|---|---|
| Golden Pyro | 868 | 837.9 |
| Pyro 1 | 867.1 | 837.9 |
| Pyro 2 | 869 | 838 |
| Range | 1.9 | 0.1 |

FIG. 6

SYSTEM AND METHOD FOR THERMALLY CALIBRATING SEMICONDUCTOR PROCESS CHAMBERS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND OF THE INVENTION

Field of the Invention

The field relates to a system and method for thermally calibrating semiconductor process chambers.

Description of the Related Art

High-temperature process chambers are used for depositing various material layers onto semiconductor substrates. A substrate, such as a silicon wafer, is placed on a wafer support (such as a susceptor) inside the reactor. Both wafer and support are heated to a desired temperature. In some wafer treatment steps, reactant gases are passed over the heated wafer, causing the chemical vapor deposition (CVD) of a thin layer of the reactant material onto the wafer. Throughout subsequent depositions, doping, lithography, etch and other processes, these layers are made into integrated circuits or other integrated devices, producing from tens to thousands, or even millions, of integrated devices, depending on the wafer size and the circuits' complexity. Other processes, such as atomic layer deposition (ALD) processes, repeatedly deposit thin monolayers of a species on the wafer.

Various process parameters are carefully controlled to ensure the high quality of the deposited layers. One such important parameter is the wafer temperature. During CVD, for example, the deposition gases react within particular prescribed temperature ranges for deposition onto the wafer. A change in temperature can result in a change in deposition rate and an undesirable layer thickness. Similarly, other semiconductor processes, such as etching, can be highly sensitive to temperatures. Accordingly, it is important to accurately control the wafer temperature to bring the wafer to the desired temperature before the treatment begins and to maintain desired temperatures throughout the process.

In order to accurately control the wafer temperature, it can be important to accurately measure the temperature of the wafer or other components of the process chamber (such as chamber walls, the susceptor, etc.). However, it can be challenging to accurately and repeatedly calibrate temperature sensors for use in process chamber environments. Accordingly, there remains a continuing need for improved systems and methods for thermally calibrating semiconductor process chambers.

SUMMARY

The systems and methods of the present disclosure have several features, no single one of which is solely responsible for its desirable attributes. Without limiting the scope of this disclosure as expressed by the claims which follow, various features will now be discussed briefly. After considering this discussion, and particularly after reading the section entitled "Detailed Description," one will understand how the features described herein provide several advantages over traditional gas delivery methods and systems.

In one embodiment, a method for thermally calibrating a semiconductor process chamber of a semiconductor process apparatus is disclosed. The method can comprise calibrating a first non-contact temperature sensor to obtain a first reading with the semiconductor process chamber, the first reading representative of a first temperature. The method can further include using the first non-contact temperature sensor to obtain a second reading representative of a second temperature of an external thermal radiation source at a first temperature setting. The method can include adjusting the second temperature of the external thermal radiation source to a second temperature setting of the external radiation source such that the second reading substantially matches the first reading.

In another embodiment, a system for thermally calibrating a semiconductor process chamber is disclosed. The system can include a first non-contact temperature sensor calibrated to have a first reading representative of a first temperature. The system can include a blackbody calibration furnace having an aperture and a heater with a plurality of temperature settings. The first non-contact temperature sensor can be configured to obtain, through the aperture, a second reading representative of a second temperature of the blackbody calibration furnace. The blackbody calibration furnace can be configured to substantially match the second reading to the first reading when the blackbody calibration furnace is placed at a first temperature setting of the plurality of temperature settings.

In another embodiment, a semiconductor processing system is disclosed. The system can include a first semiconductor process chamber. The system can include a first non-contact temperature sensor configured to measure a first temperature of a portion of the first semiconductor process chamber or of a first wafer within the first semiconductor process chamber. The system can include a second semiconductor process chamber that is of the same type as the first semiconductor process chamber. The system can include a second non-contact temperature sensor configured to measure a second temperature of a portion of the second semiconductor process chamber or of a second wafer within the second semiconductor process chamber. The first and second non-contact temperature sensors can be calibrated relative to a common external thermal radiation source.

BRIEF DESCRIPTION OF THE DRAWINGS

These and other features, aspects and advantages of the present invention will now be described with reference to the drawings of several embodiments, which embodiments are intended to illustrate and not to limit the invention.

FIG. 5 is a table illustrating example readout temperatures for a plurality of desired temperature readings.

FIG. 6 is a table illustrating readings from three different optical pyrometers directed to a wafer within a chamber and calibrated by the processes described herein, along with thermocouple readings for each chamber from a center thermocouple below susceptor supporting the wafer, where the thermocouple is calibrated by reference to the optical pyrometer of the corresponding chamber, for an example semiconductor process recipe.

DETAILED DESCRIPTION

Figure 1:
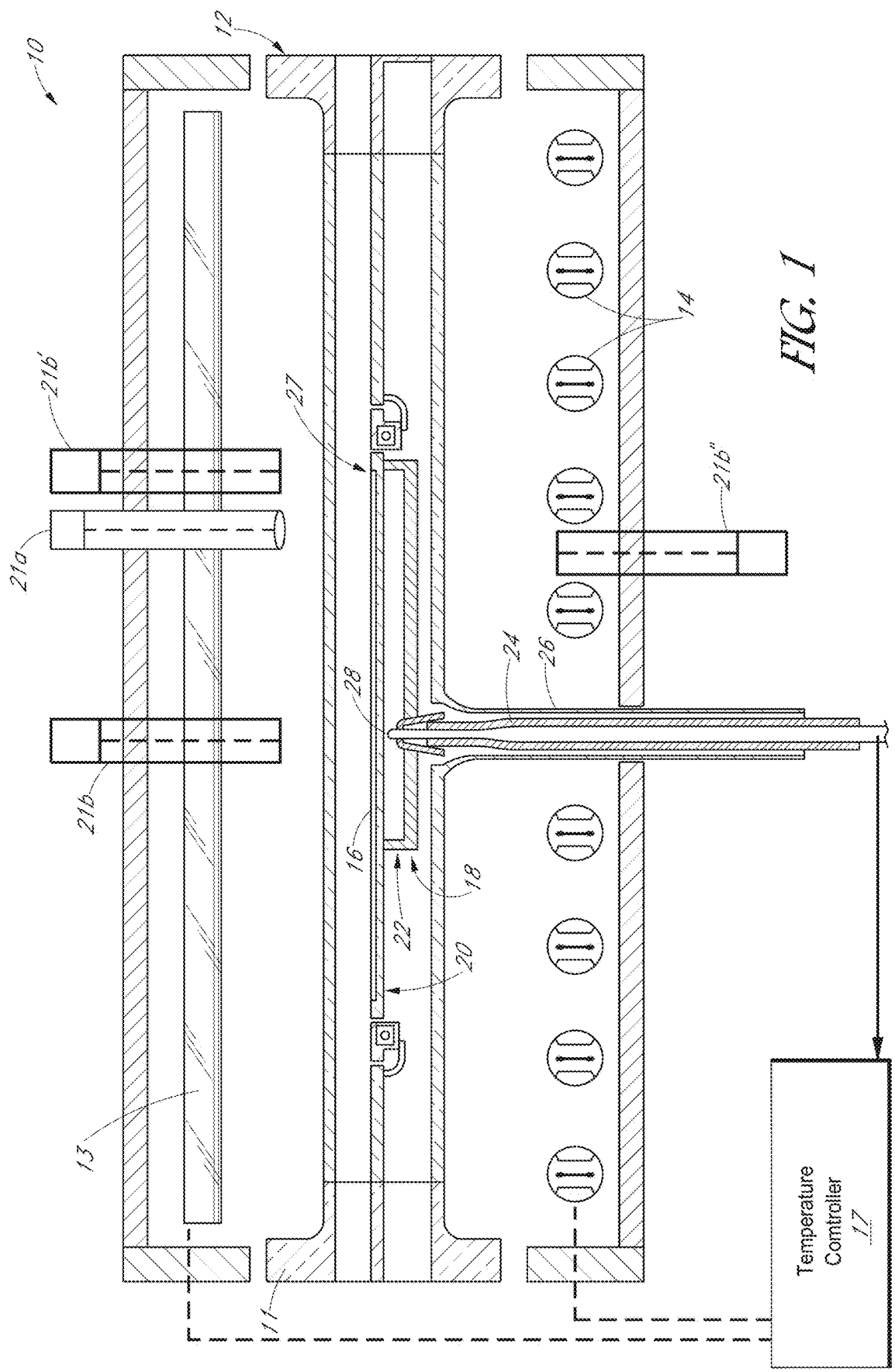
FIG. 1 is schematic side sectional view of a semiconductor process chamber, according to one embodiment.

Various embodiments disclosed herein relate to systems and methods for thermally calibrating semiconductor process chambers, such as process chambers used for chemical vapor deposition (CVD), atomic layer deposition (ALD), etching, plasma deposition, lithography, or any other suitable semiconductor processing technique. As explained above, it can be important to accurately control the temperature within a process chamber so that the wafers undergo high-yield, high-quality processes, e.g., so that layers are uniformly deposited on the wafers for deposition processes. However, it can be challenging to accurately calibrate temperature measurements of the process chambers.

For example, in some semiconductor process chambers, such as a single-wafer, horizontal flow CVD chamber commercially available from ASM International N.V. of Almere, The Netherlands under the trade name EPSILON, a first reference non-contact temperature sensor (e.g., a first reference pyrometer) can be thermally calibrated to a reference temperature measured by a first contact temperature sensor (e.g., a thermocouple or thermocouple-instrumented wafer) placed in close proximity to, or contacting, the wafer or other portion of a first semiconductor process chamber. The first reference non-contact temperature sensor can be transferred and installed onto a second process chamber. A second contact temperature sensor (e.g., a thermocouple or thermocouple-instrumented wafer) of the second process chamber can be calibrated using the first reference non-contact temperature sensor. The first reference non-contact temperature sensor can be removed, and a second reference non-contact temperature sensor can be installed and calibrated using the second, calibrated contact temperature sensor. This sequence can be repeated for subsequent process chambers, non-contact temperature sensors, and contact temperature sensors. Additional details of this calibration process may be found throughout U.S. Patent Publication No. 2018-0114680A1, published Apr. 26, 2018, the entire contents of which are incorporated by reference herein in their entirety and for all purposes.

In some situations, this calibration technique may be costly, time-consuming, and susceptible to erroneous calibrations. For example, slight differences in dimensions, sensor positions, materials and other variations from chamber to chamber may lead to a cascade of inaccuracies that reduce the accuracy of the calibration. Accordingly, various embodiments disclosed herein address these issues by calibrating an external thermal radiation source, separate from and positioned outside the process chamber, to a reference non-contact temperature sensor (e.g., a reference pyrometer). The calibrated external thermal radiation source, such as a blackbody furnace, can be programmed or configured to mimic the thermal environment of the reference process chamber such that additional non-contact temperature sensors can be calibrated to the external thermal radiation source, instead of calibrated to in-situ temperature sensors. Thus, the embodiments disclosed herein can enable consistently calibrated non-contact temperature sensors, which can also be used to consistently calibrate contact temperature sensors, and result in temperature control to generate similar (e.g., substantially the same) thermal environments for a particular process recipe that can be generated across two or more process chambers, or across two or more process sequences, to improve wafer process results. For example, multiple process chambers may be utilized in a cluster type tool or in a high volume manufacturing environment in which multiple process tools run the same process recipes.

FIG. 1 is schematic side sectional view of a semiconductor process apparatus 10, according to one embodiment. The process apparatus 10 of FIG. 1 comprises a high temperature chemical vapor deposition (CVD) chamber, but it should be appreciated that the embodiments disclosed herein can be used in conjunction with any suitable type of process chamber, such as an atomic layer deposition (ALD) chamber, an etching process chamber, a plasma chamber, etc. In any of these environments it may be beneficial to employ accurately and consistently calibrated non-contact temperature sensors. In the apparatus 10 of FIG. 1, a wafer 16 is supported within a reaction chamber 12 upon a wafer support 18. The support 18 includes a spider 22 supporting a susceptor 20 upon which the wafer 16 rests. The spider 22 is mounted to a shaft 24, which extends downwardly through a tube 26 depending from the chamber 12 lower wall.

The process apparatus 10 is equipped with a heating system comprising linear radiant heating elements 13, 14 used to raise the wafer 16 to the process temperature. Each of the elongated tube-type heating elements 13, 14 can comprise a high intensity tungsten filament lamp. Such lamps produce radiant heat energy that is transmitted through quartz walls of the reaction chamber 12 without appreciable absorption. As is known in the art of semiconductor processing, the power of the various lamps, 13, 14, can be controlled independently or in grouped zones in response to temperature sensors. Process temperatures may be, for example, between about 400° C. and 1200° C. A temperature controller 17 can be provided to control the temperature within the reaction chamber 12 based on feedback signal(s) received from temperature sensors 21a, 21b, and/or from signals received from the lamps 13, 14. The temperature controller 17 can comprise processing electronics stored configured to process the temperature data, and based on that processed data, send an actuation signal to the lamps 13, 14 to increase or decrease the temperature of the reaction chamber 12.

A contact-type temperature sensor 28, for example, a thermocouple, is shown below the wafer, in close proximity thereto, and is positioned inside the tube 26 that depends from the chamber 12 lower wall. The contact temperature sensor 28 can contact or be placed in close proximity to the wafer 16 to measure the temperature of the wafer, by way of the susceptor 20, before, during, or after operation of the process apparatus 10. While only a center contact temperature sensor 28 is labeled, the apparatus 10 can have multiple additional contact temperature sensors, for example at leading, trailing and side edges within the "slip" ring that surrounds the susceptor 20. In addition, as shown in FIG. 1, a first, wall non-contact temperature sensor 21a can be positioned so as to measure a temperature of a wall 11 of the process apparatus 10. In various embodiments, the wall 11 can comprise quartz. As shown, the wall non-contact temperature sensor 21a can be placed such that the sensor 21a has a line of sight to the wall 11 during a temperature measurement. The temperature of the wall 11 can be used to deduce or estimate the temperature of the wafer 16 or of other components of the process chamber 10. Although the wall non-contact temperature sensor 21a is shown positioned entirely outside the reaction chamber 12, in other embodiments, at least a portion of the wall non-contact sensor 21a may be positioned within the process chamber 10. In addition, as shown in FIG. 1, a second, wafer non-contact temperature sensor 21b can be positioned so as to measure a temperature of the wafer 16 directly. As shown in FIG. 1, for example, the second sensor 21b can be provided over an interior region of the wafer 16. In other embodiments, however, a second temperature sensor 21b' can alternatively, or additionally, measure the temperature of the wafer 16 by way of the susceptor 20. For example, as shown in FIG. 1, the alternative position of the second sensor 21b can be positioned outside a perimeter of the wafer 16 so as to measure the temperature of the susceptor 20, and the temperature of the wafer 16 can be inferred or determined based on that measured temperature. The sensor 21b' of FIG. 1 can be used to measure the temperature at an outside region 27 of the susceptor 20, which can be exposed laterally outside the wafer 16 when the wafer 16 is positioned on the susceptor 20. In still other arrangements, the second temperature sensor 21b'' can alternatively, or additionally, measure the temperature of the wafer 16 by way of the susceptor 20, and can be positioned below the wafer 16 and susceptor 20. The second sensor 21b'' shown in FIG. 1 can be configured to measure the temperature of a bottom surface of the susceptor 20. Still other arrangements may be suitable. Accordingly, in various embodiments, the non-contact sensors 21a, 21b, 21b', 21b'' can be used to measure a temperature of the process chamber or process apparatus 10 (e.g., a temperature of one or more of the wall 11, the wafer 16, and the susceptor 20). In some embodiments, the process apparatus 10 can comprise only the sensors 21a, 21b, and not the sensor 21b' or 21b''. In other embodiments, the process apparatus 10 can comprise only the sensors 21a, 21b', and not the sensors 21b, 21b''. In other embodiments, the process apparatus 10 can comprise only the sensors 21a, 21b'', and not the sensors 21b, 21b'. In still other embodiments, the process apparatus 10 can comprise all of the illustrated non-contact sensors, e.g., the sensors 21a, 21b, 21b', and 21b''. Any suitable number of sensors can be provided.

As with the wall sensor 21a, the wafer non-contact temperature sensor 21b (or 21b', or 21b'') can have a line of sight to the wafer 16 (or the susceptor 20) before, during, or after operation of the process apparatus 10. In the illustrated embodiments, the wall and wafer non-contact sensors 21a, 21b, 21b', 21b'' comprise optical pyrometers. In other embodiments, however, other types of non-contact type sensors may be used. Moreover, although the sensors 21a, 21b, 21b', 21b'' are described as measuring the temperature of the chamber wall 11 and the wafer 16 (e.g., directly or by way of measuring the temperature of the susceptor 20), respectively, in other embodiments, one or more non-contact temperature sensors (e.g., pyrometers) can be used to measure the temperature of other components of the process apparatus 10, such as the temperature of upper or lower quartz walls or graphite and/or silicon carbide components, like the temperature compensation ring surrounding the susceptor 20.

In temperature control systems, a thermocouple is sometimes referred to as a contact-type sensor because it is frequently placed in contact with the article (e.g., the wafer 16, the susceptor 20, or the wall 11) where temperature is to be sensed. However, it is sometimes positioned slightly spaced from, or in close proximity to, that article. A thermocouple senses temperature by thermal transfer with respect to the article to be measured. A sensor of this type shall be referred to in this document as a contact-type sensor, but that term as used herein is intended to include thermocouples that are positioned close to, but not actually contacting, the article to be sensed. Furthermore, "contact-type sensor" is intended to include a temperature sensor that operates by heat transfer even though it is not a thermocouple. By contrast, an optical pyrometer is often referred to as a non-contact-type sensor, because it is normally considerably spaced from the article being sensed and measures radiation emitted by the wafer or other article (e.g., chamber wall, susceptor, etc.). For purposes of this document, a non-contact-type sensor is intended to include not only a pyrometer but other sensors that can sense temperature remotely. Optical pyrometers, carefully positioned in or near the processing chamber, can determine wafer temperature directly by measuring the light radiation emitted by the wafer or by other portions of the reaction chamber 12. Pyrometers react to temperature changes faster than do thermocouples and, therefore, do not significantly lag the wafer temperature. Of course, if direct or reflected light from the heating lamps reaches the pyrometer, light radiation emitted by the wafer may be only a part of the radiation the pyrometer receives, and temperature readings may be in error.

Thus, the non-contact temperature sensors 21a, 21b, 21b', 21b'' and the contact temperature sensor 28 can measure the temperature of the wafer 16 or other portions of the process apparatus 10 before, during, or after operation of the process apparatus 10. In various embodiments, one or both of the non-contact temperature sensors 21a, 21b, 21b', 21b'' can be configured to monitor the temperature of the chamber 12 or components within it (such as quartz walls) and/or the wafer 16 (e.g., directly or by way of the susceptor 20), and the contact temperature sensor 28 can be configured to control the temperature during operation. In such embodiments, the non-contact temperature sensors 21a, 21b, 21b', 21b'' serve as monitors to ensure the temperature controls are operating as expected. In other embodiments, the contact temperature sensor 28 can be configured to monitor the temperature of the chamber 12, or components thereof, and/or the wafer 16, and one or more of the non-contact temperature sensors 21a, 21b, 21b', 21b'' can be configured to control the temperature during operation. In such embodiments, the contact temperature sensor(s), 28 etc. serve as monitors to ensure the temperature controls are operating as expected. In still other embodiments, the contact temperature sensor 28 and one or both of the non-contact temperature sensors 21a, 21b, 21b', 21b'' can be configured to both monitor and control the temperature during operation, for example, different sensors can operate to control the temperature by feedback loop during different stages of processing (e.g., low temperature stages, high temperature stages, temperature ramping steps, etc.). In still other embodiments, non-contact temperature sensors can be calibrated during processing or between wafers by reference to contact temperature sensor readings, and vice versa. In various embodiments, both the contact and non-contact sensors can be used to monitor the temperature during operation. In some embodiments, both the contact and non-contact sensors can be used to control the temperature during operation.

Figure 2A:
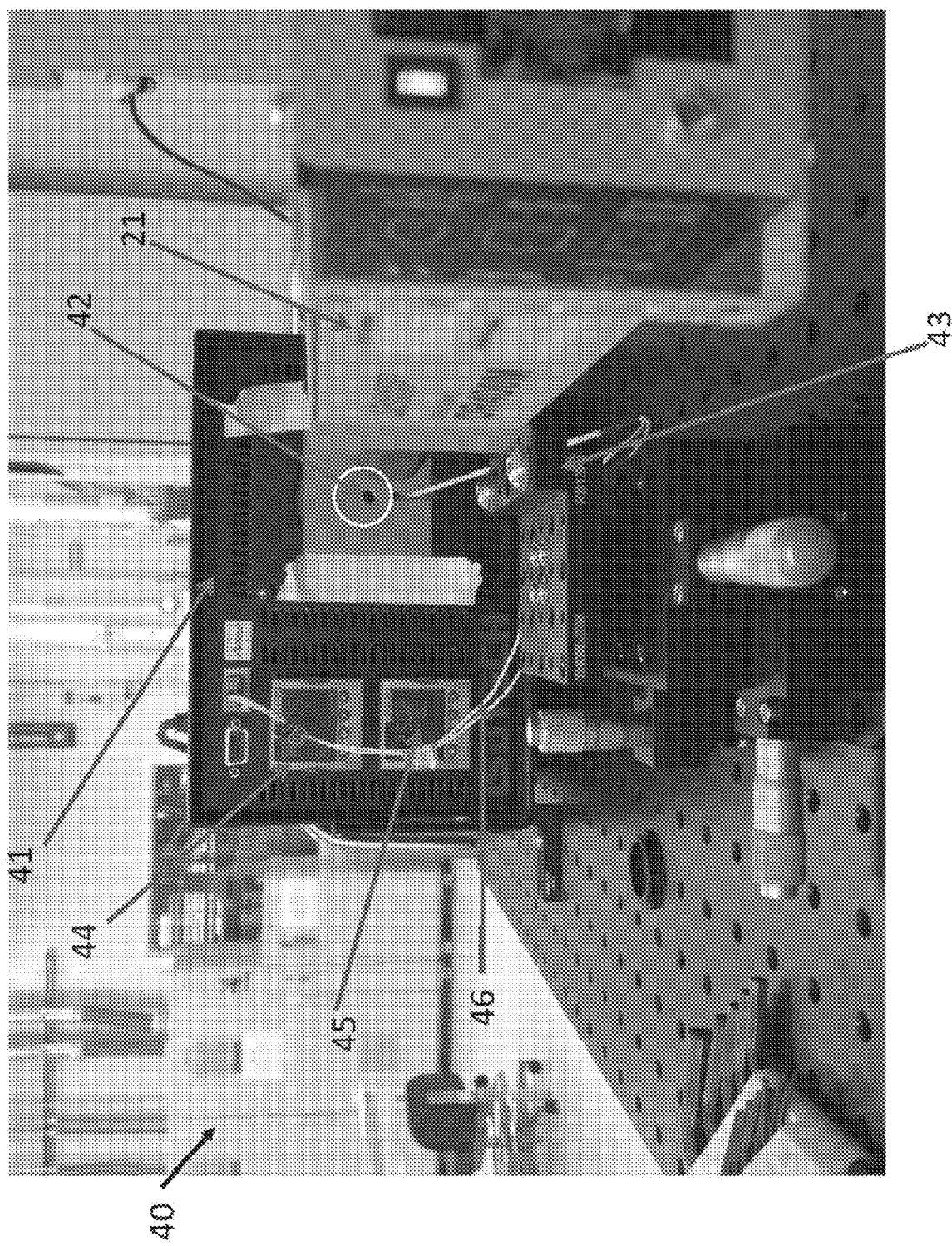
FIG. 2A is an image showing an example apparatus for calibrating a temperature sensor for a semiconductor process chamber, according to various embodiments.
Figure 2B:
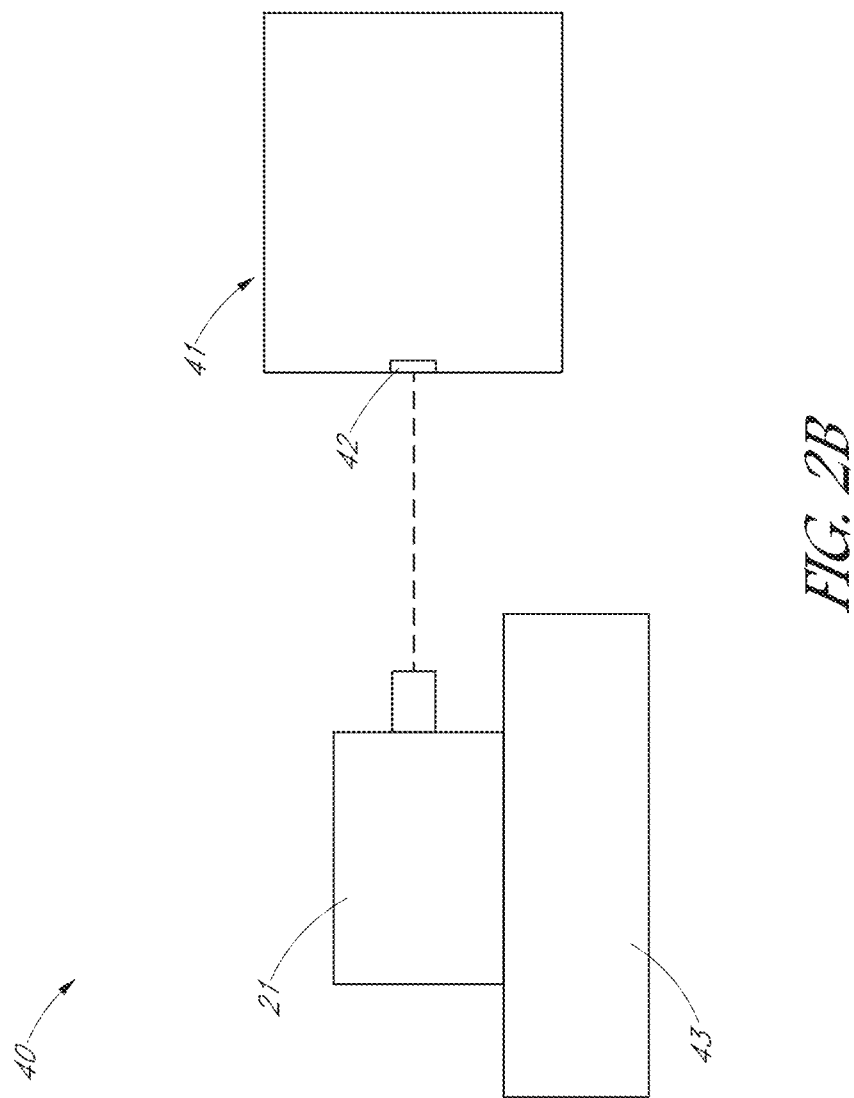
FIG. 2B is a schematic side view of the system of FIG. 2A.

FIG. 2A is an image showing an example apparatus 40 for calibrating a semiconductor process apparatus, according to various embodiments. FIG. 2B is a schematic side view of the system 40 of FIG. 2A. The system 40 of FIGS. 2A-2B can be used to calibrate non-contact temperature sensors, such as the sensors 21a, 21b, 21b', 21b" of FIG. 1. For example, the system 40 can be used to calibrate non-contact temperature sensors (such as pyrometers) that are configured to measure the temperature of the wall 11 the chamber 10, the wafer 16, or other locations within or on the chamber 12 or apparatus 10 (e.g., the susceptor 20).

As shown in FIGS. 2A-2B, the system 40 can comprise an external thermal radiation source 41 that is separate from and outside the process apparatus 10. In the illustrated embodiment, the external thermal radiation source 41 comprises a blackbody calibration furnace, in which a heater is configured to generate heat within the furnace that physically models a blackbody radiation source. Blackbody sources can be employed by pyrometer manufacturers to calibrate pyrometers prior to shipping under an assumption that the target to be measured in the end-use application resembles a blackbody. The external thermal radiation source 41 can comprise an aperture 42 that is transparent to infrared radiation. For example, in some embodiments, the aperture 42 can comprise a hole or opening in the radiation source 41. In other embodiments, an infrared-transparent plate or lens can be provided over the aperture 42. In FIG. 2A, the aperture 42 can comprise a hole formed through a brass cover. The aperture 42 can have a diameter in a range of 6 mm to 7 mm, e.g., about 6.5 mm.

A non-contact temperature sensor 21, which may be similar to the sensors 21a, 21b, 21b', 21b" described above in FIG. 1, may be positioned on a movable stage 43. As explained above, in some embodiments, the non-contact temperature sensor 21 can comprise a pyrometer. The movable stage 43 (which may be operably connected to a motor) can be configured to align the temperature sensor 21 in three-dimensions (e.g., X, Y, and Z coordinates) so as to provide a line of sight between sensitive elements of the sensor 21 and the aperture 42 that provides optical communication with the interior of the furnace. Infrared radiation emitted by the furnace can pass through the aperture 23 and can be received by the sensitive elements of the non-contact temperature sensor 21. The non-contact temperature sensor 21 can have circuitry that converts the infrared radiation detected by the sensitive elements to a temperature reading that can be viewed by the user or transmitted to a computer system or controller. In various embodiments, the non-contact temperature sensor 21 can be calibrated by adjusting a sensor factor (SF) that adjusts the sensitivity of the sensor 21, such that the temperature readout changes with changing SF. In other embodiments, the calibration of the non-contact temperature sensor can be performed in program adjustments to the temperature controllers for the processing apparatus 10 to adjust the controllers' response to the non-contact temperature sensor readings.

As shown in FIG. 2A, a blackbody temperature indicator 44 can be configured to provide a reading of the estimated temperature within the external radiation source 41. A temperature sensor 46 (e.g., a thermocouple) can be provided inside the external thermal radiation source 41 so as to measure the temperature in the external radiation source 41. In addition, as shown in FIG. 2A, the system 40 can comprise a temperature setting interface 45, which may be representative of a set temperature of the heater that provides thermal energy to the furnace. The user can adjust the temperature setting interface 45 to change the set temperature of the heater at any of a plurality of temperature settings.

Figure 3:
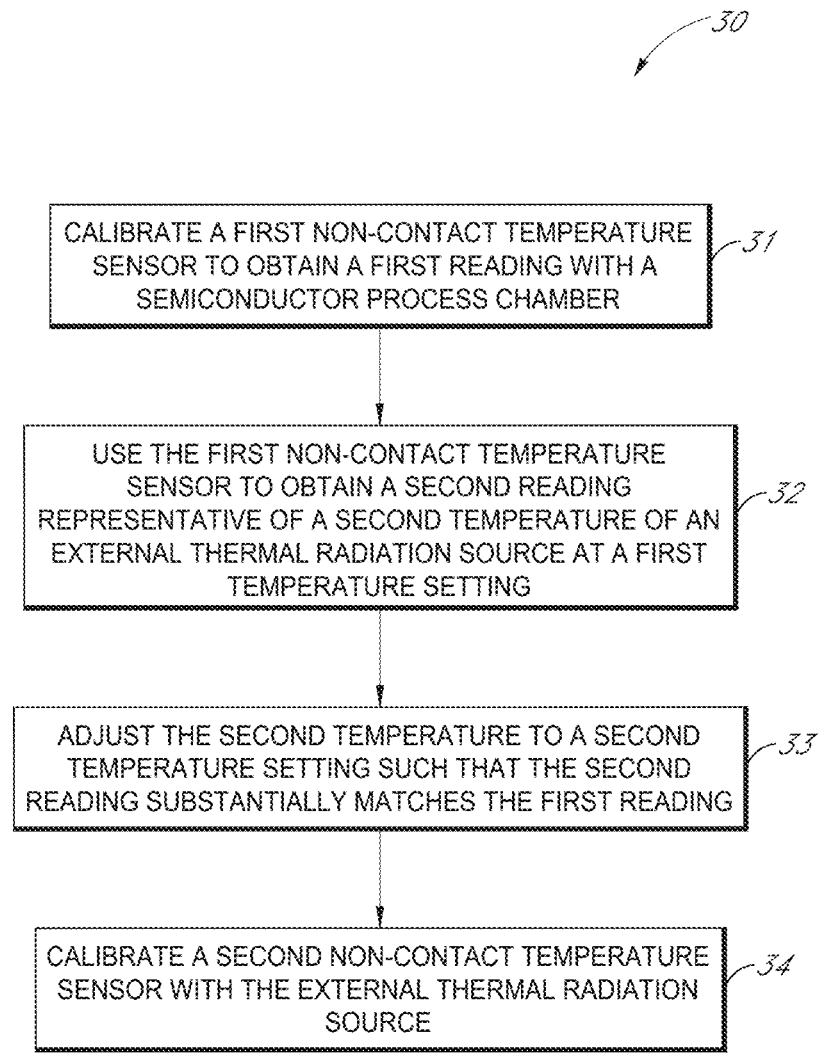
FIG. 3 is a flowchart schematically illustrating a method for thermally calibrating a semiconductor process chamber, according to various embodiments.

FIG. 3 is a flowchart schematically illustrating a method 30 for thermally calibrating a semiconductor process chamber, such as the process apparatus 10 of FIG. 1, according to various embodiments. The process apparatus 10 can be subjected to a process recipe that includes one or more temperature set point(s). As explained above, some in-situ calibration techniques may be costly, time-consuming, and imprecise. The method 30 of FIG. 3 represents an ex-situ method that, for each particular temperature set point, calibrates non-contact temperature sensor(s) 21 based on an external thermal radiation source 41 (separate from and outside the process chamber), such as a blackbody calibration furnace. Beneficially, the method 30 of FIG. 3 can enable accurate thermal calibrations that are time- and cost-efficient.

The method 30 begins in a block 31, in which a first non-contact temperature sensor 21 (such as a pyrometer) is calibrated to obtain a first reading with a semiconductor process chamber. The first reading of the first non-contact temperature sensor 21 can be representative of a first temperature of a portion of the semiconductor reaction chamber 12 or of a wafer 16 within the reaction chamber 12. The first temperature can accordingly correspond to a particular location within the reaction chamber 12 or on the wafer 16. In various embodiments, the first non-contact temperature sensor 21 can comprise either of the sensors 21a, 21b, 21b', 21b" depending on what temperatures are to be calibrated. For example, if the calibration is to be based on a temperature of the chamber wall 11, then the first non-contact sensor 21 can comprise the wall non-contact sensor 21a of FIG. 1 that is configured to measure a temperature of the wall 11, in which case the first temperature would comprise the measured temperature of the wall 11. If the calibration is to be based on a temperature of the wafer 16, then the first non-contact sensor 21 can comprise the wafer sensor 21b of FIG. 1 that is configured to measure a temperature of the wafer 16, in which case the first temperature would comprise the measured temperature of the wafer 16. In other embodiments, the first temperature can correspond to a temperature measured at other portions of the process apparatus 10, for example, a temperature of the susceptor 20, etc., for example, using the sensor 21b'.

The first non-contact temperature sensor 21 can be calibrated in any suitable way. For example, in some embodiments, a contact temperature sensor, such as the central contact temperature sensor 28 under the susceptor, can be used to accurately measure the temperature of the susceptor, and the first non-contact temperature sensor (e.g., the sensor 21b) can be calibrated to have a first reading that substantially matches the reading of the contact temperature sensor 28. Alternatively, a wafer with embedded contact temperature sensors (e.g. thermocouples) can be used for the calibration, which may improve the accuracy of the contact temperature measurements. In other embodiments, a contact temperature sensor (not shown) can be used to accurately measure the temperature of the wall 11, and the first non-contact temperature sensor (e.g., the sensor 21a) can be calibrated to have a first reading that substantially matches the reading of the contact temperature sensor. For example, one or more readings of the contact temperature sensor can be compared to one or more readings of the first non-contact temperature sensor. Thus, in block 31, the first non-contact temperature sensor can be calibrated to a known first temperature of a portion of the process chamber (e.g., the chamber wall 11, susceptor, etc.), or to a known first temperature of the wafer 16, where "known" can represent a contact temperature sensor reading. As just one example, if the contact sensor 28 determines that the temperature of the wafer 16 is 820° C., then the first reading or readout of the non-contact sensor 21b (or sensor 21b' or 21b") can be calibrated to be approximately 820° C. as well. Although block 31 has been described in connection with a calibration relative to a contact temperature sensor (e.g., a thermocouple), in other embodiments, the first non-contact temperature sensor can be calibrated based on other types of temperature sensors, including other non-contact temperature sensors. Furthermore, the calibration method 30 can be repeated at different temperature settings programmed into the temperature controllers, depending on the process recipe. For example, for different temperature settings of different process recipes, or for different temperature set points within a single process recipe, the measured first temperature at the location in the reaction chamber 12 or wafer may vary, such that for each recipe and temperature setting, the non-contact temperature sensor 21 can be calibrated. A non-contact temperature sensor so calibrated can be referred to as the "golden pyrometer" or "golden pyro" in examples below, in view of the fact that it is subsequently used for setting the external thermal radiation source, which in turn can be employed for calibrating multiple subsequent non-contact temperature sensors.

Moving to block 32, the first non-contact temperature sensor can be used to obtain a second reading representative of a second temperature of an external thermal radiation source 41. The external thermal radiation source 41 can be separate from, and positioned outside of, the process chamber 10, so as to provide an ex-situ calibration source. In various embodiments, as explained herein, the external thermal radiation source 41 can comprise a temperature-controlled furnace, e.g., a blackbody calibration furnace, as explained above in connection with FIGS. 2A-2B. For example, as explained herein, the external thermal radiation source 41 can comprise a heater, a temperature setting interface 45 (e.g., representative of a set temperature of the heater), a temperature sensor 46 (contact or non-contact) configured to measure the second temperature within the radiation source 41, and an indicator 44 that indicates the temperature within the radiation source 41.

Continuing with the particular example set forth above in connection with block 31, at block 32 the initial measurement of the second temperature of the external thermal radiation source 41 may result in a second reading (by the first non-contact temperature sensor) of 800° C. when the heater is initially set at a first temperature setting at the temperature setting interface of 820° C. The difference between the first reading (e.g., 820° C.) and the second reading (e.g., 800° C.) of the first non-contact temperature sensor 21 in this example indicates that the thermal environment (e.g., temperature) of the external thermal radiation source 41 is different from the thermal environment (e.g., temperature) of the portion of the process chamber 10 or the wafer 16.

At block 33, the method 30 can adjust the external thermal radiation source 41 such that the external thermal radiation source 41 mimics the thermal environment within the reaction chamber 12 (e.g., the temperature of the chamber wall 11 or the temperature of the wafer 16). For example, the second temperature of the external thermal radiation source 41 can be adjusted to a second temperature setting such that the second reading of the first non-contact temperature sensor 21 substantially matches the first reading. For example, while the first non-contact temperature sensor 21 is being used to measure the temperature of the radiation source 41, the user can engage the temperature setting interface 45 to change the temperature settings of the heater. The temperature settings of the heater can be adjusted, e.g. using trial and error, until, and such that, the second reading substantially matches the first reading. In the example, discussed above, the temperature settings can be adjusted to a first temperature setting of, for example, 843.4° C., such that the second reading of the first non-contact temperature sensor 21 is approximately 820° C., e.g., approximately the same temperature value that the first non-contact temperature sensor 21 measured during calibration with the contact temperature sensor 28 in block 31. This means that, in order to mimic the environment of the reaction chamber 12 for calibration of non-contact temperature sensors at a process temperature of 820° C. (at the position within the chamber 12 of interest), the external thermal radiation source 41 should be set to 843.4° C.

Accordingly, in FIG. 3, at block 31, the first non-contact temperature sensor 21 can be calibrated to a known reference temperature in the process chamber 10. Then at blocks 32 and 33, the calibrated first non-contact temperature sensor 21 can then be used to determine the first temperature setting of the external thermal radiation source 41 (e.g., a heater input setting of 843.4° C.), which yields a second reading of the external thermal radiation source 41 that substantially matches the first reading within the process chamber 10 (e.g., a reading on the first non-contact sensor of about 820° C.). Thus, when the external thermal radiation source 41 is turned to the second temperature setting (e.g., 843.4° C.), the external thermal radiation source 41 can mimic the thermal environment of the process chamber 10 (e.g., of the wall 11, the wafer 16, etc.) and can be used to calibrate other sensors (e.g., other pyrometers) for use in the same process recipe at the same measurement position in other process apparatuses 10 of the same kind.

As used herein, the second reading can substantially match the first reading if the first and second readings represent similar thermal environments. In some embodiments, for example, the first and second readings may be match to within 1 decimal place, more particularly within 2 decimal places, as measured in Celsius. In various embodiments, the first and second readings may match to within about +/−0.1° C.

The method 30 of FIG. 3 can move to a block 34 to calibrate a second non-contact temperature sensor 21 (such as another pyrometer of the same type, model, etc. as the first or "golden" non-contact temperature sensor) with the external thermal radiation source 41. As explained above in block 33, when the external thermal radiation source 41 is set to the first temperature setting, the external thermal radiation source 41 may mimic the thermal environment of the reaction chamber 12. It may be desirable to provide additional temperature sensors 21 in other process apparatuses 10 without repeating the calibration steps described above. Accordingly, in block 34, the second non-contact temperature sensor 21 (and any additional subsequent non-contact sensors) can be calibrated ex-situ (outside of the process chamber 10) by using the known thermal environment of the external thermal radiation source 41 at the second temperature setting, which approximates the thermal environment of the reaction chamber 12. In various embodiments, contact sensors (such as sensor 28) can also be calibrated relative to the calibrated non-contact sensors 21.

Figure 4:
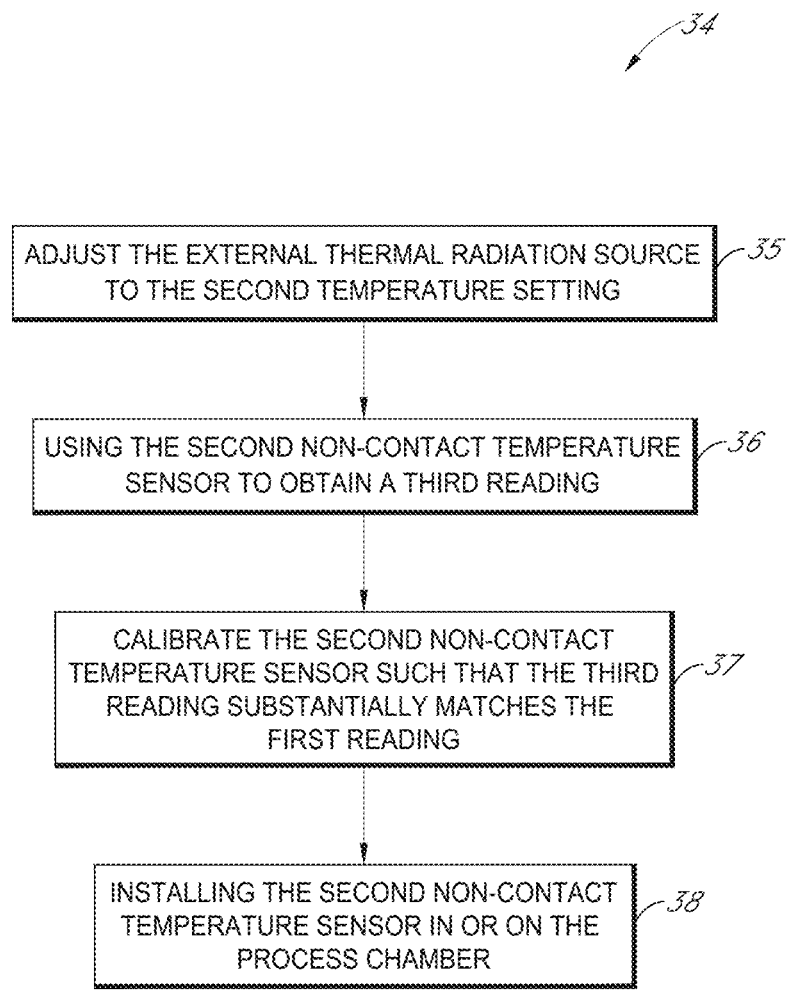
FIG. 4 is a flowchart illustrating a method for calibrating a non-contact temperature sensor, according to various embodiments.

FIG. 4 is a flowchart illustrating additional details of the method 34 described above in FIG. 2. The method 34 can proceed in a block 35 in which the external thermal radiation source 41 is adjusted to or maintained at the second temperature setting determined above in block 33 (e.g., at a heater input temperature setting of 843.4° C.). As explained above, when the external thermal radiation source 41 is placed at the second temperature setting, the external thermal radiation source 41 can mimic the thermal environment of the reaction chamber 12 (e.g., at a temperature of about 820° C. at the measurement location of interest). In a block 36, the second non-contact temperature sensor 21 can be used to obtain a third reading representative of the second temperature of the external thermal radiation source 41. If the third reading differs from the first reading (e.g., 820° C. in the example described above), then the method 30 moves to a block 37 to calibrate the second non-contact temperature sensor 21. In block 37, for example, a sensor factor (SF) associated with the second non-contact temperature sensor 21 can be adjusted such that the third reading substantially matches the first reading (e.g., 820° C.). The SF can be adjusted in any suitable manner, such as by tuning an interface or button on the second non-contact sensor 21 or otherwise adjusting the programming of the sensor 21 itself. Once the SF has been tuned such that the reading of the second non-contact sensor 21 substantially matches the first reading, then the second non-contact temperature sensor 21 may be calibrated to the thermal environment of the process chamber 10. Alternatively, calibration of the second non-contact sensor may be accomplished by adjusting the temperature control programming to adjust to the readings of the second non-contact sensor. For example, in some embodiments, software connected to the apparatus 10 can be programmed or adjusted such that the reading of the apparatus 10 (e.g., by way of a user interface) displays the correct temperature reading even though the readout on the sensor 21 may be unchanged. In such embodiments, post-processing can be performed on the measured temperature signal such that the user still sees the correct calibrated temperature reading.

Turning to block 38, the second non-contact temperature sensor 21 can be installed on the process apparatus 10, or in another process apparatus that is similar to the process apparatus 10 (e.g., same model). For example, the second non-contact temperature sensor 21 can be installed to detect a temperature of the wall 11 of the reaction chamber 12, of the wafer 16, or of other components of the process apparatus 10. Because the second non-contact temperature sensor 21 is installed in either the process apparatus or a similar type of process apparatus (e.g., another similar CVD reactor), the external thermal radiation source 41 can calibrate the second sensor 21 by mimicking the thermal environment of process chambers having the same mechanical or thermal characteristics. Additional non-contact temperature sensors can be likewise calibrated to the thermal environment of the process chamber by adjusting the respective SFs until the readouts from the sensors substantially match the first readout, when the external thermal radiation source is placed at the second temperature setting. The calibrated non-contact sensors can then be installed in process chambers that are similar to the calibration or reference process chamber (e.g., that have a similar thermal environment as the reference process chamber) As explained above, the installed non-contact temperature sensors 21 can be configured to monitor temperatures in the process chamber 10, to control the temperatures in the process chamber 10, to monitor and control temperatures in the process chamber 10, and/or to calibrate the contact temperature sensors or vice versa.

The method 30 of FIGS. 3-4 is illustrated at a particular applied temperature of the process chamber 10. It should be appreciated that the method 30 can be repeated for different applied temperatures, and the non-contact temperature sensors 21 can be similarly calibrated at those different applied temperatures so that the calibration system 40 can be used to calibrate different processing temperatures.

FIG. 5 is a table illustrating example readout temperatures for a plurality of desired temperature readings. For example, Column (1) shows the desired readout temperatures for a non-contact temperature sensor 21 (sensor A) that corresponds to the calibrated temperature setting of the process chamber 10 or wafer 16, for a plurality of applied temperatures to the process chamber 10. For example, the desired readout temperatures of Column (1) may represent the first temperature reading that was calibrated in block 31 of FIG. 3 based on, for example, a contact temperature sensor 28 (or instrumented wafer-which is actually how this data was generated). Column (2) shows the furnace temperature settings that are to be applied to obtain the desired readout in Column (1). For example, the temperatures in Column (2) can correspond to the second temperature setting of the heater for the external thermal radiation source 41 as obtained in block 33, for a plurality of corresponding applied temperatures to the process chamber 10.

Columns (3) and (4) show the second readings of two distinct non-contact temperature sensors 21 (sensors B and C), which were previously calibrated on the chamber as in block 31 using the same method as sensor A. Columns (3) and (4) show that the second readings of sensors B and C of the sensor 21 are substantially matched to the desired readouts in Column (1) when the heater is placed at the second temperatures settings of sensor A shown in Column (2). For example, as shown, the temperature readings of all three sensors 21 can be within +/−5° C. of the desired readouts across a wide range of temperatures, with the error decreasing toward higher temperatures where signal/noise ratio is largest. At 820° C., the readout difference can be within about +/−2° C. This demonstrates that the second temperature setting of a single sensor 21 can be used to mimic the thermal environment of the chamber accurately and therefore be used to calibrate additional sensors 21 ex situ to obtain the same reading in situ.

FIG. 6 is a table illustrating the average readings during the same process recipe from three different optical pyrometers previously calibrated by the methods described herein and directed at a wafer 16 within a chamber 12. Also shown are the average thermocouple readings from a center thermocouple below the susceptor supporting the wafer, which in this case is being used for the temperature control. The table of FIG. 6 illustrates that when non-contact sensors 21 are calibrated using the methods described herein, the sensors 21 can be both accurately calibrated and precisely matched to each other and can beneficially produce readings within +/−1° C. of each other when running the same process recipe.

Figure 7:
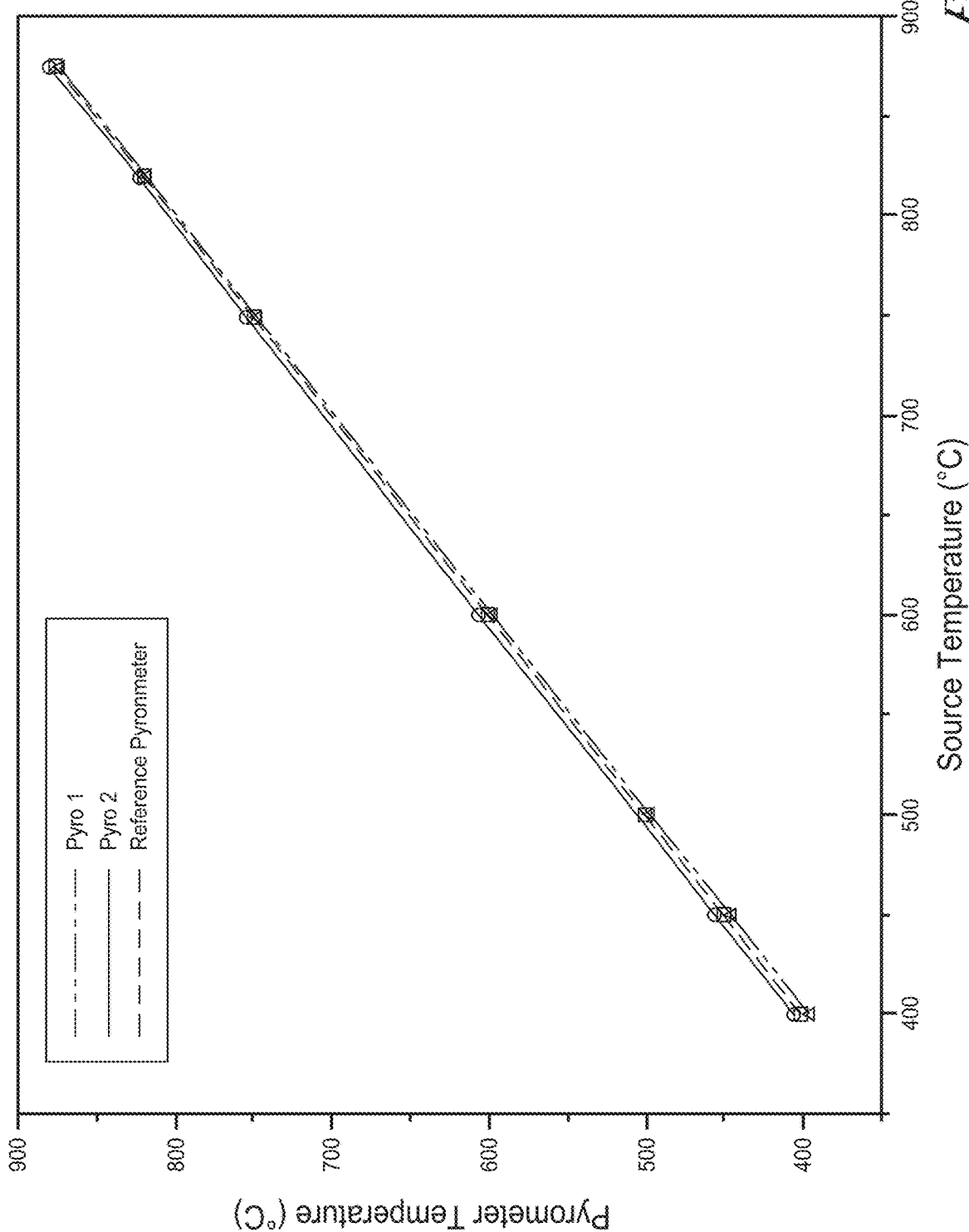
FIG. 7 is a graph that plots readings of a non-contact temperature sensor over a plurality of source temperatures, according to various embodiments.

FIG. 7 is a graph that plots readings of a non-contact temperature sensor 21 (e.g., a pyrometer) over a plurality of furnace source temperatures, according to various embodiments. In particular, the graph of FIG. 7 plots the data shown in FIG. 5, with the horizontal axis representative of the data in Column (2) of FIG. 5 and the vertical axis representative of the data in Columns (1), (3), and (4) of FIG. 5. In this example, the set temperature of the external thermal radiation source 41 was varied from about 400° C. to almost 900° C. The resulting pyrometer readouts for a Reference Pyrometer used to calibrate the thermal radiation source 41 (e.g., a first non-contact temperature sensor), Pyro 1 (a second non-contact temperature sensor), and Pyro 2 (a third non-contact temperature sensor) are plotted across the plurality of temperature set points of the source 41. As shown in FIG. 7, the relationship between pyrometer readout and set temperature may be generally linear. Furthermore, as shown in FIG. 7, there is very little variability in the calibration curves, as evidenced by the high degree of correlation among the plots for the Reference Pyrometer, Pyro 1, and Pyro 2.

Although the foregoing has been described in detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention. Moreover, not all of the features, aspects and advantages described herein above are necessarily required to practice the present invention.

What is claimed is:

1. A semiconductor processing system comprising:
    a first semiconductor process chamber;
    a first non-contact temperature sensor configured to measure a first temperature of a portion of the first semiconductor process chamber or of a first wafer within the first semiconductor process chamber;
    a second semiconductor process chamber that is of the same type as the first semiconductor process chamber; and
    a second non-contact temperature sensor configured to measure a second temperature of a portion of the second semiconductor process chamber or of a second wafer within the second semiconductor process chamber,
    wherein the first non-contact temperature sensor calibrates an external thermal radiation source.

2. The system of claim 1, wherein the first and second semiconductor process chambers comprise chemical vapor deposition (CVD) reactors.

3. The system of claim 1, further comprising the external thermal radiation source.

4. The system of claim 3, wherein the external thermal radiation source comprises a blackbody furnace.

5. The system of claim 1, wherein the first and second non-contact temperature sensors comprise optical pyrometers.

6. The system of claim 1, wherein the first and second semiconductor process chambers comprise atomic layer deposition (ALD) reactors.

7. The system of claim 1, wherein each of the first and second semiconductor process chambers comprises a substrate support configured to support the respective first wafer or second wafer.

8. The system of claim 1, wherein each of the first and second semiconductor process chambers comprises a heating system.

9. The system of claim 8, wherein each of the first and second semiconductor process chambers comprises a temperature controller configured to control a temperature within the respective semiconductor process chamber based on one or more respective feedback signals received from the first and second non-contact temperature sensors and/or based on one or more respective signals received from the heating system.

10. The system of claim 9, wherein the temperature controller comprises processing electronics configured to process temperature data, and based on the processed temperature data, to send an actuation signal to the heating system to increase or decrease the temperature of the respective semiconductor process chamber.

11. The system of claim 8, wherein the heating system comprises a plurality of linear radiant heating elements.

12. The system of claim 1, wherein each of the first and second semiconductor process chambers comprises a quartz wall.

13. The system of claim 1, wherein the external thermal radiation source is a single external thermal radiation source.

14. A semiconductor processing system comprising:
    a first semiconductor process chamber;
    a first non-contact temperature sensor configured to measure a first temperature of a portion of the first semiconductor process chamber or of a first wafer within the first semiconductor process chamber;
    an external thermal radiation source, wherein the external thermal radiation source is calibrated relative to a measurement from the first non-contact temperature sensor;
    a second semiconductor process chamber; and
    a second non-contact temperature sensor configured to measure a second temperature of a portion of the second semiconductor process chamber or of a second wafer within the second semiconductor process chamber,
    wherein the second non-contact temperature sensor is calibrated relative to the external thermal radiation source.

15. The system of claim 14, wherein one or more of the first and second semiconductor process chambers comprise chemical vapor deposition (CVD) reactors.

16. The system of claim 14, wherein one or more of the first and second semiconductor process chambers comprise atomic layer deposition (ALD) reactors.

17. The system of claim 14, wherein each of the first and second semiconductor process chambers comprise a substrate support configured to support the respective first wafer or second wafer.

18. The system of claim 14, wherein each of the first and second semiconductor process chambers comprises a heating system.

19. The system of claim 18, wherein each of the first and second semiconductor process chambers comprises a temperature controller configured to control a temperature within the respective semiconductor process chamber based on one or more respective feedback signals received from the first and second non-contact temperature sensors and/or based on one or more respective signals received from the heating system.

20. A semiconductor processing system comprising:
    a first semiconductor process chamber;
    a first non-contact temperature sensor configured to measure a first temperature of a portion of the first semiconductor process chamber or of a first wafer within the first semiconductor process chamber;
    an external radiation source, wherein the external radiation source is configured to mimic one or more characteristics of the first semiconductor process chamber;
    a second non-contact temperature sensor configured to measure a second temperature portion of the first semiconductor process chamber or of the first wafer within the first semiconductor process chamber, wherein the second non-contact temperature sensor is calibrated relative to the external radiation source;
a second semiconductor process chamber; and
a third non-contact temperature sensor configured to measure a third temperature of a portion of the second semiconductor process chamber or of a second wafer within the second semiconductor process chamber, wherein the third non-contact temperature sensor is calibrated relative to the external radiation source.

* * * * *